United States Patent [19]

Kuwata

[11] Patent Number: 5,331,185
[45] Date of Patent: Jul. 19, 1994

[54] FIELD EFFECT TRANSISTOR HAVING A GAINAS/GAAS QUANTUM WELL STRUCTURE

[75] Inventor: Nobuhiro Kuwata, Yokohama, Japan

[73] Assignee: Sumitomo Electric Industries, Ltd., Japan

[21] Appl. No.: 151,895

[22] Filed: Nov. 15, 1993

Related U.S. Application Data

[62] Division of Ser. No. 912,732, Jul. 13, 1992, Pat. No. 5,286,662.

[30] Foreign Application Priority Data

Jul. 17, 1991 [JP] Japan ................... 3-176977

[51] Int. Cl.$^5$ ................... H01L 29/161; H01L 29/80; H01L 29/56
[52] U.S. Cl. ................... 257/192; 257/196; 257/201; 257/280; 257/607; 257/615
[58] Field of Search ............... 257/192, 194, 196, 201, 257/280, 607, 615

[56] References Cited

U.S. PATENT DOCUMENTS 5,091,759  2/1992  Shih et al. ................... 257/192

FOREIGN PATENT DOCUMENTS 0249371  12/1987  European Pat. Off. ........... 257/192
62-276882 12/1987  Japan ................... 257/192
63-250863 10/1988  Japan ................... 257/192
 1-5074   1/1989  Japan ................... 257/192
 3-284434 11/1990  Japan ................... 257/192

*Primary Examiner*—Ngan Ngo
*Attorney, Agent, or Firm*—Beveridge, DeGrandi, Weilacher & Young

[57] ABSTRACT

A field effect transistor (FET) has a gate electrode, a source electrode and a drain electrode formed on a GaInAs/GaAs quantum well layer structure having an undoped GaAs layer, an impurity doped GaInAs layer, and an undoped GaAs cap layer. The FET further has low resistivity regions formed by ion-implantation in a source region and the drain region of the GaInAs/GaAs quantum well layer structure, and has the impurity doped GaInAs layer as a channel, and further has an undoped GaAs cap layer with a 30–50 nm thickness. An annealing temperature for activating the low resistivity region is not higher than a temperature at which the GaInAs/GaAs quantum well structure substantially breaks and not lower than a temperature at which the sheet resistivity of the low resistivity region sufficiently reduces. The FET thus manufactured has desired characteristics for the GaInAs/GaAs quantum well structure and the low resistivity region, and attains low noise and high speed operation.

5 Claims, 3 Drawing Sheets

FIELD EFFECT TRANSISTOR HAVING A GAINAS/GAAS QUANTUM WELL STRUCTURE

This is a divisional of co-pending application Ser. No. 07/912,732 filed on Jul. 13, 1992, now U.S. Pat. No. 5,286,662.

BACKGROUND OF THE INVENTION

1. Field of the Invention

The present invention relates to a field effect transistor (FET) which operates with low noise at a high speed and can be fabricated with high uniformity, and a method for manufacturing the same.

2. Related Background Art

An FET which has a GaInAs/GaAs quantum well structure and has a GaInAs layer as a channel is disclosed in JP-A-63-90861, JP-A-63-272080 and JP-A-64-2371. Those FETS utilize the fact that GaInAs has a higher electron mobility than GaAs and overcomes a drawback that GaInAs cannot form a good Schottky barrier with the ability of GaAs by replacing GaInAs with GaAs to attain a high speed operation. However, demands for high speed are still strong and it has been proposed to form a low resistivity area by ion implantation to the source and drain regions of an FET having a GaInAs/GaAs quantum well structure to reduce stray serial resistance in order to meet those demands.

In such an FET, however, there is a risk of breakdown for the quantum well structure in an annealing process of the low resistivity area due to a difference between lattice constants of GaInAs and GaAs.

IEEE Electron Device Letter, Vol. 9 1988, pp 621–623 and "A study of the thermal stability of (In, Ga)As strained quantum well structures as a function of overlayer thickness" of Inst. Phys. Conf. Ser. No.96 chapter 6, page 365-370, which is presented at Symp. GaAs and Related Compounds, Atlanta, Ga. 1988, teach that the thermal stability of the GaInAs/GaAs quantum well structure is significantly improved by increasing the thickness of a GaAs cap layer on GaInAs (to 500 nm). However, when the GaAs cap layer on GaInAs is thickened and a gate electrode is formed on the GaAs cap layer, current in an n-type GaInAs channel cannot be fully modulated and good characteristics for the FET cannot be attained. In order to solve this problem, it has been proposed to form a groove called a recess when a gate electrode is to be formed, and form the gate electrode at the bottom of the recess in order to reduce a distance between the channel and the gate electrode, but it is technically difficult to form a recess having a uniform depth and therefore uniformity of the characteristic of the FET is lost.

SUMMARY OF THE INVENTION

It is an object of the present invention to provide an FET which has a GaInAs/GaAs quantum well structure and source and drain low resistivity areas for reducing stray series resistance and which has a structure to suppress non-uniformity in characteristics, and a method for manufacturing the same.

In order to achieve the above object, the FET of the present invention comprises: a GaInAs/GaAs quantum well structure having an undoped GaAs buffer layer; an impurity doped GaInAs channel layer and an undoped GaAs cap layer formed on a semi-insulating semiconductor substrate; a source region and a drain region of low resistivity formed by ion-implanting impurities from the surface of the GaInAs/GaAs quantum well layer to reach at least the impurity doped GaInAs channel layer and annealing them; a gate electrode formed on said undoped GaAs cap layer between the source region and the drain region; and a source electrode and a drain electrode having at least portions thereof formed on said undoped GaAs cap layer and on the source region and the drain region. The undoped GaAs cap layer has a flat surface in an area including at least the area of said gate electrode, said source region and said drain region and has a thickness of 30–50 nm.

A method for manufacturing the FET of the present invention comprises a first step of epitaxially growing on a semi-insulating semiconductor substrate, a GaInAs/GaAs quantum well layer having an undoped GaAs buffer layer, an impurity doped GaInAs channel layer and an undoped GaAs cap layer; a second step of ion-implanting impurities from the surface of said GaInAs/GaAs quantum well layer to reach at least said impurity doped GaInAs layer and annealing them to form a source region and a drain region of low resistivity, and a third step of forming a gate electrode, a source electrode and a drain electrode on one flat surface of said undoped GaAs cap layer.

The undoped GaAs cap layer formed in the first step has a thickness of 30–50 nm and the annealing in the second step is rapid thermal annealing (RTA).

The FET of such a structure and the method for manufacturing the same resulted from the study and experiments described below.

As shown in FIG. 1, a GaInAs/GaAs quantum well structure 22 consisting of an undoped GaAs layer 23 having a thickness of 1000 nm an undoped $Ga_{1-x}In_xAs$ layer 24 (X=0.18) having a thickness of 10 nm and an undoped GaAs cap layer 25 having a thickness of 40 nm was formed on a semi-insulating GaAs substrate 21. Then, $SiN_X$ film was deposited to a thickness of 80 nm by a plasma CVD method, as an arsenic capturing protection layer on a GaInAs/GaAs quantum well structure 22, and the substrate was annealed by a rapid thermal annealing (RTA) method in a temperature range of 800° C.–900° C. for two seconds. Then, photo-luminescence intensities at a temperature of 4.2K were estimated as shown in FIG. 2. Light emission from the quantum well was observed up to 860° C., but no substantial photo-luminescence (PL) emission was observed at 900° C. and it was seen that the quantum well was completely broken. It has thus been proved first by the experience of the inventors that the quantum well structure is maintained even at a temperature above 800° C.

On the other hand, an Si-doped $Ga_{1-x}In_xAs$ layer (x=0.18, impurity concentration $N_D=4\times10^{18}$ cm$^{-3}$) was used in place of the undoped $Ga_{1-x}In_xAs$ layer 24 and Si was ion-implanted (90 kev, $6\times10^{13}$ cm$^{-2}$) into the source-drain region to form an FET, and it was annealed in a temperature range of 800° C.–900° C. Then, a sheet resistivity of the ion-implanted region was measured by a Hall measurement method. The temperature dependency of the sheet resistivity on the annealing temperature is shown in FIG. 3. It has been known that a source resistance can be sufficiently reduced if the sheet resistivity is no larger than 230 Ω/□. Accordingly it is seen from the characteristic chart that the RTA must be done above 800° C.

It is seen from the above two measurements that the source resistance can be sufficiently reduced and the GaAs/GaInAs quantum well structure is maintained if the RTA is conducted between 800° C. and 860° C.

While the thickness of the GaAs cap layer 25 is 40 nm in the above example, it has been known by experimentation that the source resistance can be sufficiently reduced and the GaAs/GaInAs quantum well structure is maintained if the thickness is no smaller than 30 nm. Further, in order to sufficiently modulate a current in an n-type GaInAs channel, it is necessary that the thickness of the GaAs cap layer is no larger than 50 nm. Accordingly, the source resistance can be sufficiently reduced and the GaAs/GaInAs quantum well structure is maintained if the thickness of the GaAs cap layer is between 30 nm and 50 nm.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

FIGS. 4A to 4H show, in sectional views, one embodiment of the present invention. A GaAs substrate 1 is used as a semiconductor substrate on which an undoped GaAs buffer layer 2 (background p-type, $p = 3 \times 10^{15}$ cm$^{-3}$) is epitaxially grown to a thickness of 500 nm by an organic metal vapor phase growth method (OMVPE method). Then, an n-type $Ga_{1-x}In_xAs$ channel layer 3 having Si uniformly doped (carrier density = $4 \times 10^{18}$ cm$^{-3}$. In composition $x = 0.18$) is grown thereon to a thickness of 10 mm. An undoped GaAs cap layer 4 (background N-type $n = 1 \times 10^{15}$ cm$^{-3}$) is the grown to a thickness of 40 nm on the n-type $Ga_{1-x}In_xAs$ channel layer 3 (See FIG. 4A).

As material for the epitaxially growth, arsine (AsH$_3$) was used for Group V element arsenic. Trimethyl gallium (TMG) was used for Group III element gallium of the undoped GaAs buffer layer 2 and the undoped GaAs cap layer 4. Triethylgallium (TEG) and trimethylindium (TMI) were used for Group III elements gallium and indium of the n-type GaInAs channel layer 4.

Figure 1:
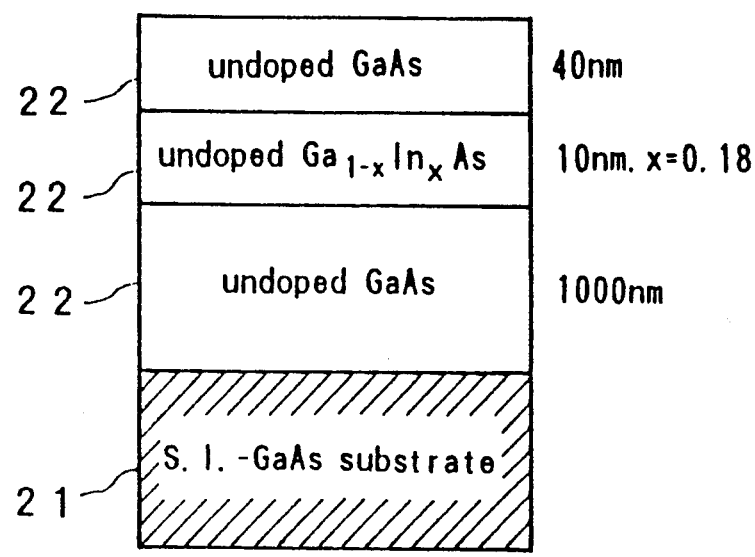
FIG. 1 shows a sectional view of an undoped GaInAs/GaAs quantum well structure.
Figure 2:
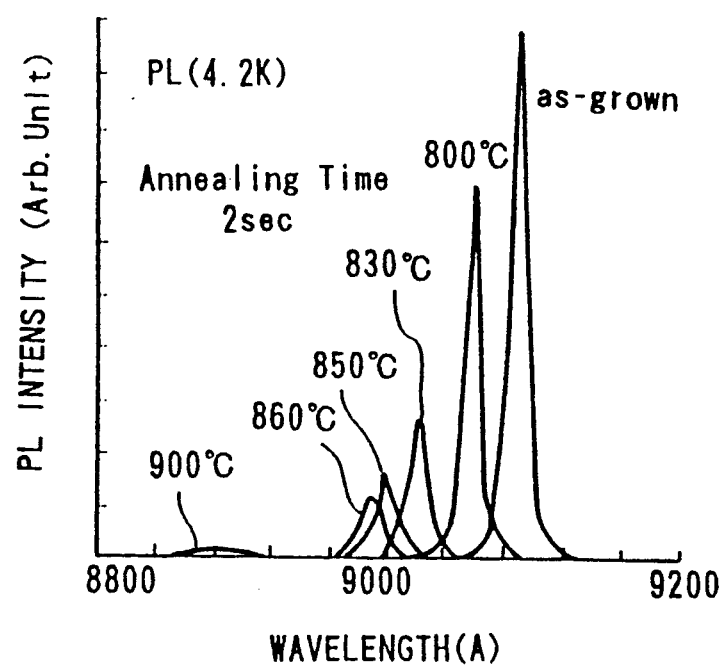
FIG. 2 shows wavelength vs PL intensity characteristics at various temperatures to which show PL emission when the undoped GaInAs/GaAs quantum well structure is annealed.
Figure 3:
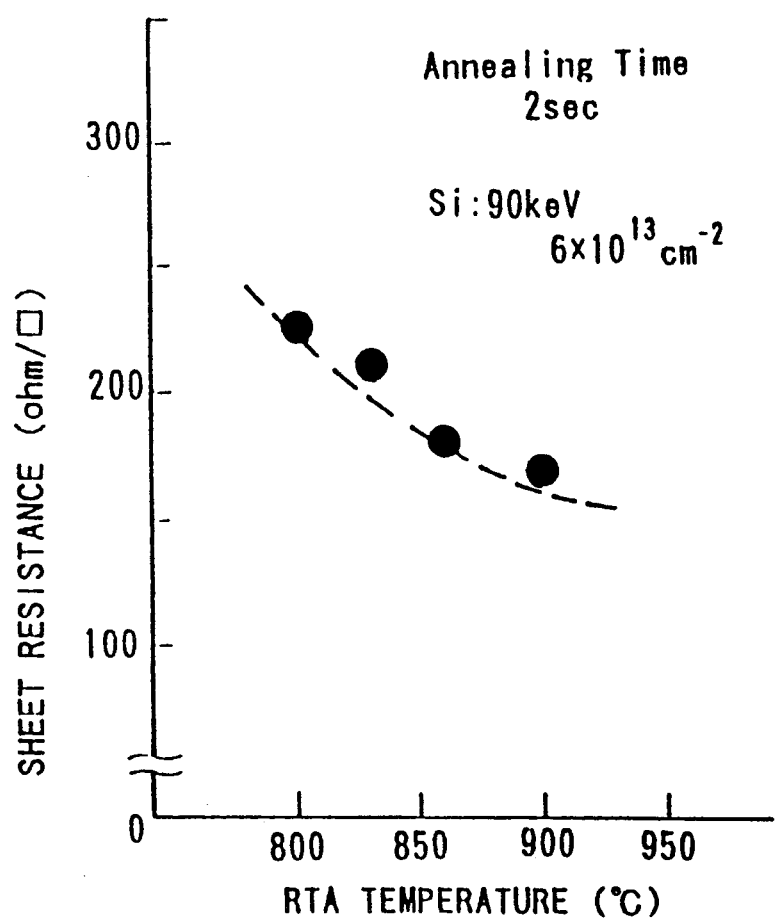
FIG. 3 shows a temperature characteristic for sheet resistivity when the undoped GaInAs layer of FIG. 1 is substituted by an Si-doped GaInAs layer and the latter is ion-implanted (Si:90 kev, $6 \times 10^{13}$ cm$^{-2}$) and annealed.
Figure 4A:
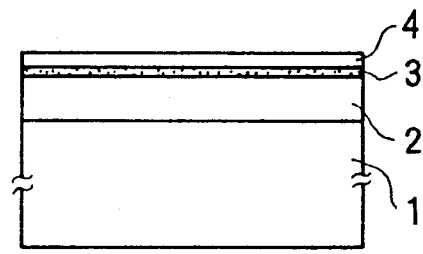
FIGS. 4A, 4B, 4C, 4D, 4E, 4F, 4G, and 4H show, in sectional views, on FET of the present invention and a method for manufacturing the same.
Figure 4B:
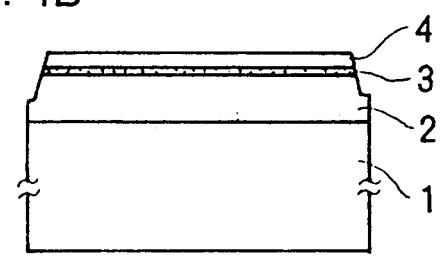
Figure 4C:
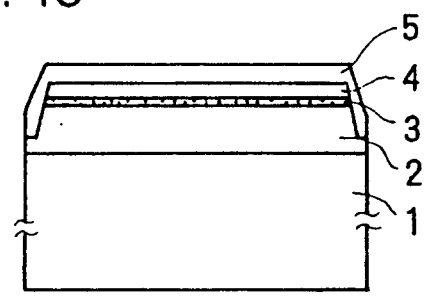
Figure 4D:
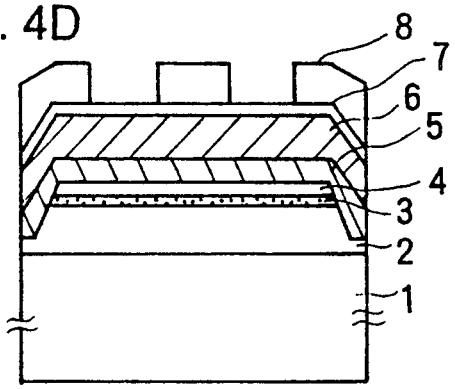
Figure 4E:
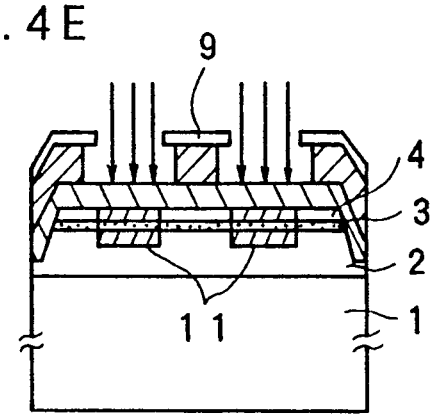
Figure 4F:
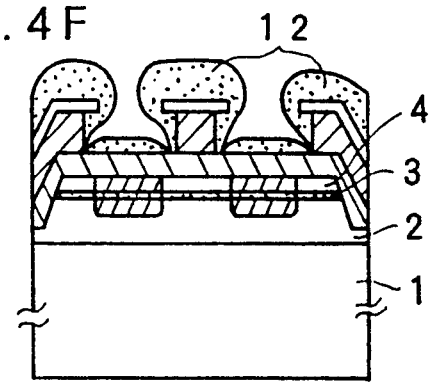
Figure 4G:
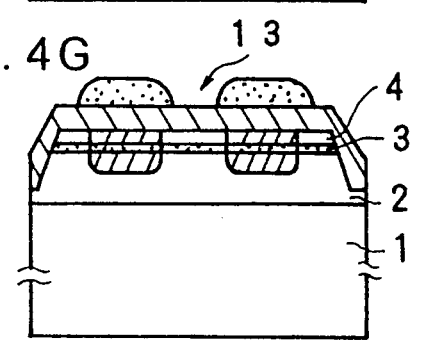
Figure 4H:
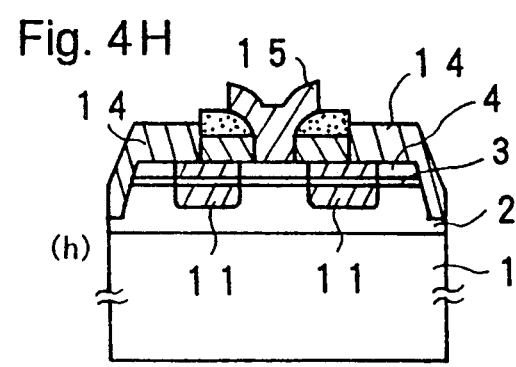

The epitaxial wafer in the above structure was mesa-etched by 300 nm by sulfuric acid etchant (see FIG. 4B). Then, an SiN$_X$ film 5 was formed to a thickness of 80 nm on the entire surface of the wafer by a plasma CVD method (See FIG. 4C). Then, a three-layer resist structure comprising a resist layer 6, an SiO$_2$ layer 7 and a resist layer 8 was formed, and a resist layer 8 was patterned (See FIG. 4D). Then, the SiO$_2$ film 7 was dry-etched by a gas mixture of CF$_4$ and H$_2$, and the lower resist layer 5 was etched by O$_2$ gas to form a T-shape dummy gate 9. Si was ion-implanted by using the T-shaped dummy gate 9 as a mask to form an n-type low resistivity region 11 (See FIG. 4E). Then, an SiO$_2$ layer 12 was deposited by a sputtering method (See FIG. 4F), a portion of the SiO$_2$ layer 12 was etched by buffered HF solution, the dummy gate was removed by acetone, and an opening 13 made of SiO$_2$ was formed (See FIG. 4G). Then, it was annealed by the rapid thermal annealing (RTA) method at 860° C. for two seconds in order to activate the ion-implanted Si. The GaAs/GaInAs quantum well structure comprising the undoped GaAs buffer layer 2, the n-type $Ga_{1-x}In_xAs$ channel layer 3 and the Undoped GaAs cap layer 4 was maintained as described above. Finally, an ohmic contact electrode 14 and a gate electrode 15 were formed to complete the FET (See FIG. 4H).

The FET having the GaInAs/GaAs quantum well structure formed in this manner showed a sufficiently small stray serial resistance and very small non-uniformity in characteristics.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A field effect transistor comprising;
    a GaInAs/GaAs quantum well structure having an undoped GaAs buffer layer, an impurity doped GaInAs channel layer and an undoped GaAs cap layer formed on a semi-insulative semiconductor substrate;
    a source region and a drain region of a low resistivity formed by ion-implanting impurities from the surface of said GaInAs/GaAs quantum well structure to reach at least said impurity doped GaInAs channel layer and annealing them;
    a gate electrode formed on said undoped GaAs cap layer between said source region and the drain region; and
    a source electrode and a drain electrode respectively having at least portions thereof formed on said undoped GaAs cap layer and on said source region and said drain region
    said undoped GaAs cap layer having a flat surface in an area including at least the area of said gate electrode, said source region and said drain region and having a thickness of 30-50 nm.

2. A field effect transistor according to claim 1, wherein the impurity doped in said impurity doped GaInAs channel layer is an n-type impurity.

3. A field effect transistor according to claim 2 wherein said n-type impurity is silicon.

4. A field effect transistor according to claim 3 wherein said undoped GaAs buffer layer exhibits a p-type semiconductor characteristic, and said undoped GaAs cap layer exhibits an n-type semiconductor characteristic.

5. A field effect transistor according to claim 4, wherein said semi-insulating semiconductor substrate is a semi-insulating GaAs substrate.

* * * * *